US011064628B2

(12) United States Patent
Thibaut et al.

(10) Patent No.: US 11,064,628 B2
(45) Date of Patent: Jul. 13, 2021

(54) RACK ADAPTED FOR RECEIVING A COMPONENT AND SYSTEM INCLUDING THE RACK AND THE COMPONENT

(71) Applicant: OVH, Roubaix (FR)

(72) Inventors: Christophe Maurice Thibaut, Houplin Ancoisne (FR); Etienne Zahm, La Madeleine (FR); Henryk Klaba, Roubaix (FR); Jules Hermann Bonenfant, Lys lez Lannoy (FR)

(73) Assignee: OVH, Roubaix (FR)

( * ) Notice: Subject to any disclaimer, the term of this patent is extended or adjusted under 35 U.S.C. 154(b) by 41 days.

(21) Appl. No.: 16/690,344

(22) Filed: Nov. 21, 2019

(65) Prior Publication Data

US 2020/0178413 A1 Jun. 4, 2020

(30) Foreign Application Priority Data

Nov. 30, 2018 (EP) .................................... 18315047

(51) Int. Cl.
| H05K 7/14 | (2006.01) |
| H01R 13/631 | (2006.01) |
| H05K 7/20 | (2006.01) |

(52) U.S. Cl.
CPC .......... *H05K 7/1489* (2013.01); *H01R 13/631* (2013.01); *H05K 7/1452* (2013.01); *H05K 7/20781* (2013.01); *H05K 7/20818* (2013.01)

(58) Field of Classification Search
None
See application file for complete search history.

(56) References Cited

U.S. PATENT DOCUMENTS 5,280,229 A 1/1994 Faude et al.
6,822,874 B1 * 11/2004 Marler ................. H05K 7/1452
361/724

(Continued)

FOREIGN PATENT DOCUMENTS

| EP | 0990377 A1 | 4/2000 |
| EP | 3364736 A1 | 8/2018 |
| WO | 9856223 A1 | 12/1998 |

OTHER PUBLICATIONS

"Charging Station", Bamboo Deluxe Charging Station, https://www.lipperinternational.com/, https://www.lipperinternational.com/products/bamboo-deluxe-charging-station/, accessed on Nov. 20, 2019, pdf 4 pages.

(Continued)

*Primary Examiner* — Jacob R Crum
(74) *Attorney, Agent, or Firm* — BCF LLP (57) ABSTRACT

A rack adapted for receiving one or more components is disclosed. The rack includes a backplane, a pair of side panels extending from the backplane and internal support members on each side to receive and mechanically guide an initial alignment of components upon their initial insertion in the rack. A pair of male connectors mounted to the backplane is configured to mate with a corresponding pair of female connectors of each component to mechanically guide a final alignment of each component when the component is further inserted in the rack. Mechanical guidance may also be provided by, or supplemented with, a connection capable of providing liquid cooling to the rack. A system including the rack and the component inserted in the rack is also disclosed.

18 Claims, 10 Drawing Sheets

(56) References Cited

U.S. PATENT DOCUMENTS

| | | | |
|---|---|---|---|
| 6,836,407 | B2 | 12/2004 | Faneuf et al. |
| 7,132,833 | B2 | 11/2006 | Layden et al. |
| 7,480,138 | B2 | 1/2009 | Kogan et al. |
| 7,562,779 | B2 | 7/2009 | Bravo et al. |
| 7,661,545 | B2 | 2/2010 | Hardy et al. |
| 9,019,706 | B2 | 4/2015 | Ming et al. |
| 9,295,169 | B1 | 3/2016 | Spinner et al. |
| 9,343,916 | B2 | 5/2016 | Emslie |
| 10,164,373 | B1 * | 12/2018 | Cheon ............ H01R 13/005 |
| 2004/0057211 | A1 | 3/2004 | Kondo et al. |
| 2006/0203460 | A1 | 9/2006 | Aviv |
| 2006/0274508 | A1 | 12/2006 | Lariviere et al. |
| 2010/0176762 | A1 | 7/2010 | Daymude et al. |
| 2011/0075349 | A1 | 3/2011 | Ma et al. |
| 2011/0134601 | A1 | 6/2011 | Sa |
| 2011/0193524 | A1 | 8/2011 | Hazzard et al. |
| 2011/0289327 | A1 | 11/2011 | Nolterieke et al. |
| 2011/0313576 | A1 * | 12/2011 | Nicewonger ............ F28D 15/00 700/282 |
| 2013/0102237 | A1 | 4/2013 | Zhou et al. |
| 2014/0062390 | A1 | 3/2014 | Webber |
| 2014/0277784 | A1 | 9/2014 | Mick et al. |
| 2015/0208551 | A1 * | 7/2015 | Davidson ............ H05K 7/20809 165/80.2 |
| 2016/0066480 | A1 | 3/2016 | Eckberg et al. |
| 2016/0205800 | A1 | 7/2016 | Roberts |
| 2017/0027068 | A1 | 1/2017 | Dane et al. |
| 2017/0027079 | A1 | 1/2017 | Dombrowski et al. |
| 2017/0047751 | A1 | 2/2017 | Fernandes |
| 2017/0164500 | A1 | 6/2017 | Van et al. |
| 2017/0359918 | A1 | 12/2017 | Klaba et al. |
| 2018/0151975 | A1 * | 5/2018 | Aoki ........................ G06F 8/654 |
| 2018/0231295 | A1 * | 8/2018 | Akiyama ............... H01L 23/427 |
| 2019/0138064 | A1 * | 5/2019 | Abali ........................ G06F 1/16 |

OTHER PUBLICATIONS

Extended European Search Report with regard to EP Patent Application No. 18315047.3 dated Sep. 2, 2019.
Partial European Search Report with regard to EP Patent Application No. 18315047.3 dated May 22, 2019.
Extended European Search Report with regard to EP Patent Application No. 19315006.7 dated Jul. 31, 2019.

* cited by examiner

RACK ADAPTED FOR RECEIVING A COMPONENT AND SYSTEM INCLUDING THE RACK AND THE COMPONENT

CROSS-REFERENCE

The present application claims priority from European Patent Application No. 18315047.3, filed Nov. 30, 2018, the entirety of which is incorporated herein by reference.

FIELD

The present technology relates to enclosures adapted to receive and provide power to electronic equipment. In particular, a rack adapted for receiving a component and a system including the rack and the component are disclosed.

BACKGROUND

Electronic components, for example servers, memory banks, computer discs, and the like, are conventionally mounted one above the other in equipment racks.

Large data centers that may contain thousands or even tens of thousands of servers. New servers may be added on a daily basis. Some servers may fail and need to be replaced from time to time. Installation and removal of components in equipment racks is a daily routine task for operators. Care must be taken to properly align components within equipment racks. When installed in haste, components may be improperly aligned in their racks, leading to equipment failure or to bad electrical and/or data connections. Consequently, installation of components in equipment racks is a delicate and time-consuming operation.

The racks, including equipment mounted in their backplanes, consume large amounts of electric power and generate significant amounts of heat. Cooling needs are important in such racks. Water-cooling may be used, but is difficult to provision in an efficient way. The need for hydraulic connections to be fully watertight is self-evident given the presence of electronic equipment.

Improvements are still desirable in the maintenance and provisioning of large data centers.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) difficulties in ensuring proper alignment of components in equipment racks and/or (2) lack of efficient methods of providing water-cooling to equipment racks.

In one aspect, various implementations of the present technology provide a rack adapted for receiving a component, comprising:
a backplane;
a pair of side panels extending from the backplane;
a support member mounted on each side panel, each support member being internal to the rack and adapted to mate with a corresponding side edge of the component to mechanically guide an initial alignment of the component upon initial insertion of the component in the rack; and
two male connectors mounted to the backplane, the two male connectors being sized and configured to mate with two female connectors of the component to mechanically guide a final alignment of the component when the component is further inserted in the rack.

In some implementations of the present technology, the two male connectors are defined in a plane perpendicular to the side panels.

In some implementations of the present technology, the side panels and the backplane extend vertically; and the support members are positioned on the side panels so that the component can be received in a horizontal position.

In some implementations of the present technology, the rack defines a plurality of parallel stages, each respective stage being adapted for receiving a respective component, each respective stage comprising: a respective support member mounted on each of the side panels, each respective support member being internal to the rack and adapted to mate with a corresponding side edge of the respective component to mechanically guide an initial alignment of the respective component upon initial insertion of the respective component in the respective stage; and a respective set of two male connectors mounted in the backplane and configured to mate with two female connectors of the respective component to mechanically guide a final alignment of the respective component when the respective component is further inserted in the rack.

In some implementations of the present technology, a spacing between each of the plurality of parallel stages corresponds to a standard-size rack unit.

In another aspect, various implementations of the present technology provide a system, comprising:
the rack and the component;
an inlet port mounted on the backplane;
an outlet port mounted on the backplane;
a slot formed on the backplane, the slot being proximally located to the inlet port and to the outlet port; and
a liquid adaptor mounted on a rear edge of the component, the liquid adaptor comprising:
a feed port adapted for mating with the inlet port when the component is inserted in the rack,
a return port adapted for mating with the outlet port when the component is inserted in the rack, and
an elongate rod having lateral extensions on an end section protruding beyond the rear edge of the component, the feed port and the return port, the elongate rod being rotatable for aligning the lateral extensions with the slot prior to full insertion of the component in the rack and for placing the lateral extensions out of alignment with the slot after full insertion of the component in the rack to cause the lateral extensions to abut on face of the backplane opposite from the component to maintain the component inserted in the rack.

In some implementations of the present technology, the two male connectors respectively comprise the inlet port the outlet port; and the two female connectors respectively comprise the feed port and the return port.

In some implementations of the present technology, one of the male connectors comprises the inlet port and the outlet port; and one of the female connectors comprises the feed port and the return port.

In some implementations of the present technology, the slot is formed between the inlet port and the outlet port.

In some implementations of the present technology, a center of the inlet port, a center of the outlet port and a center of the slot form a triangle.

In some implementations of the present technology, the system further comprises: an inlet tube connected to the inlet port; and an outlet tube connected to the outlet port; the inlet tube and the outlet tube being mounted behind the backplane for distributing liquid cooling within the rack.

In some implementations of the present technology, the system further comprises: feed tube mounted to the feed port; and a return tube mounted to the return port; the feed tube and the return tube extending toward a front of the component for providing liquid cooling to the rack.

In some implementations of the present technology, the elongate rod extends to a front edge of the component.

In some implementations of the present technology, the rack defines a plurality of parallel stages, the inlet port, the outlet port, the slot, the component and the liquid adaptor being part of a given one of the parallel stages, an additional component being insertable in each other stage of the rack.

In a further aspect, various implementations of the present technology provide a system, comprising:
a rack comprising:
  a backplane,
  an inlet port and an outlet port mounted on the backplane, and
  a slot formed on the backplane, the slot being proximally located to the inlet port and to the outlet port;
a component insertable in the rack; and
a liquid adaptor mounted on a rear edge of the component, the liquid adaptor comprising:
  a feed port adapted for mating with the inlet port when the component is inserted in the rack,
  a return port adapted for mating with the outlet port when the component is inserted in the rack, and
  an elongate rod having lateral extensions on an end section protruding beyond the rear edge of the component, the feed port and the return port, the elongate rod being rotatable for aligning the lateral extensions with the slot prior to full insertion of the component in the rack and for placing the lateral extensions out of alignment with the slot after full insertion of the component in the rack to cause the lateral extensions to abut on a face of the backplane opposite from the component to maintain the component inserted in the rack.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in computer-readable media and so executed by a computer or processor, whether or not such computer or processor is explicitly shown.

With these fundamentals in place, we will now consider some non-limiting examples to illustrate various implementations of aspects of the present technology.

The present technology allows to efficiently mount equipment in a rack, including without limitation servers, data storage solutions, and the like. In at least one variant, fluidic connections may be included for the provision of liquid cooling.

In one aspect, the present technology introduces a component insertable in a rack that includes a pair of female connectors that come in alignment with a pair of male connectors located in the backplane of the rack when the component is inserted. The rack includes mechanical guides to generally locate the insertable components. The female connectors of a given insertable component and the male connectors in the backplane of the rack are positioned so that, when the given component is at least partially inserted in the rack and the rear end of the given component is placed near the backplane, precise mechanical alignment of the given component is provided by partial and then full insertion of the male connectors in the female connectors.

In an embodiment, a plurality of pairs of male connectors are mounted in the backplane, each pair being vertically separated from a next pair by a typical height of the insertable components so that plural insertable components can be received in this manner in the rack.

In the same or another embodiment, fluidic connections for the supply of liquid cooling in the backplane of the rack are provided. In addition to the above described rack and component, a liquid adaptor is mounted on the component. The liquid adaptor includes a feed port and a return port that are respectively meant for mating with an inlet port and an outlet port in the backplane of the rack. An elongate rod part of the liquid adaptor has an end section that penetrates in a slot of the backplane. Rotating the elongate rod locks the component in place against the backplane, within the rack. In a variant, the inlet and outlet ports may supplement the male connectors and the feed and return ports may be provided in addition to the female connectors. In another variant, the inlet and outlet ports may form one or both of the male connectors and the feed and return ports may form one or both of the female connectors.

In the present specification, the term rack should be understood as synonymous with enclosure, chassis, cabinet and similar terms. The term system may encompass a combination of elements, including without limitation a rack and a component inserted in the rack.

Figure 1:
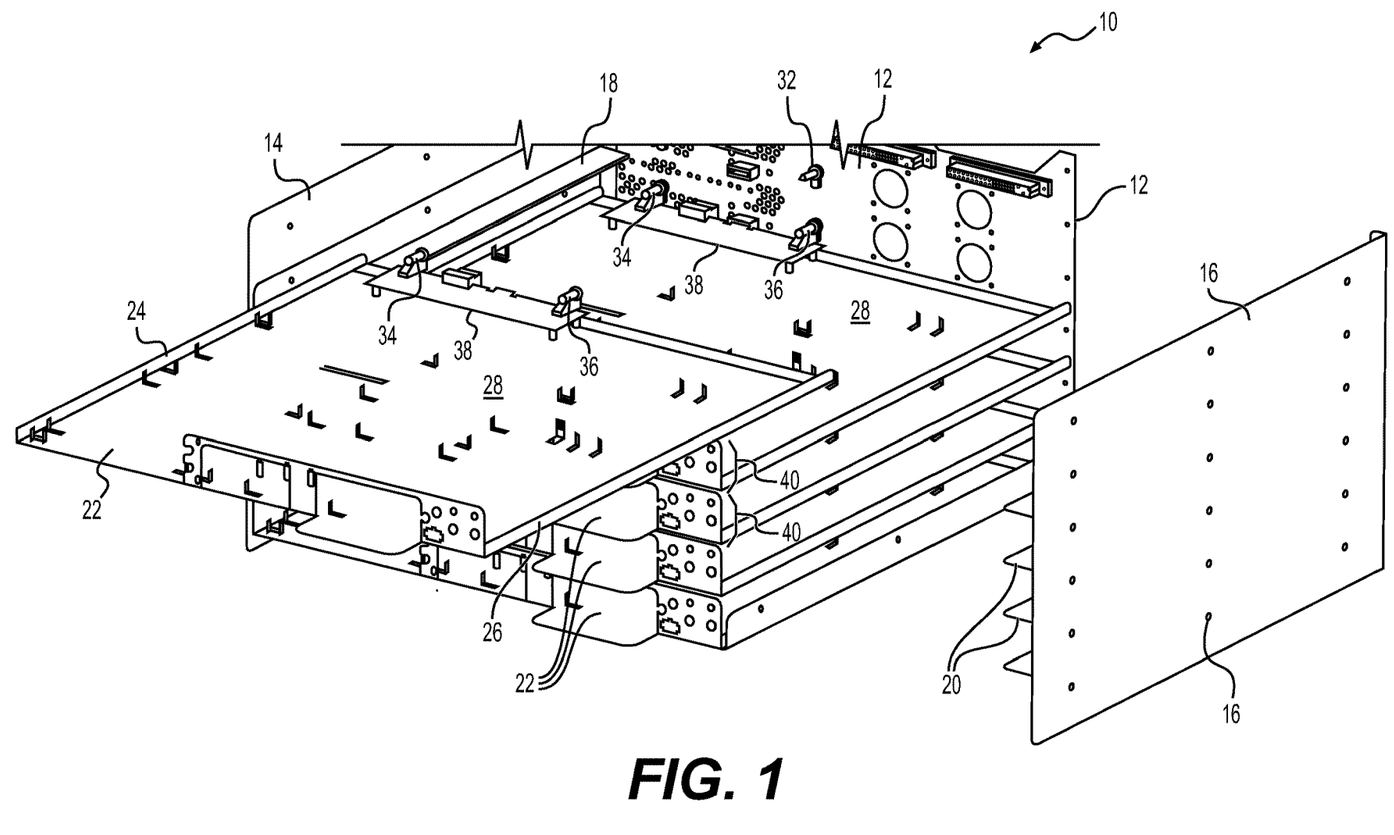
FIG. 1 is a perspective, exploded view of a rack in accordance with an embodiment of the present technology.
Figure 2:
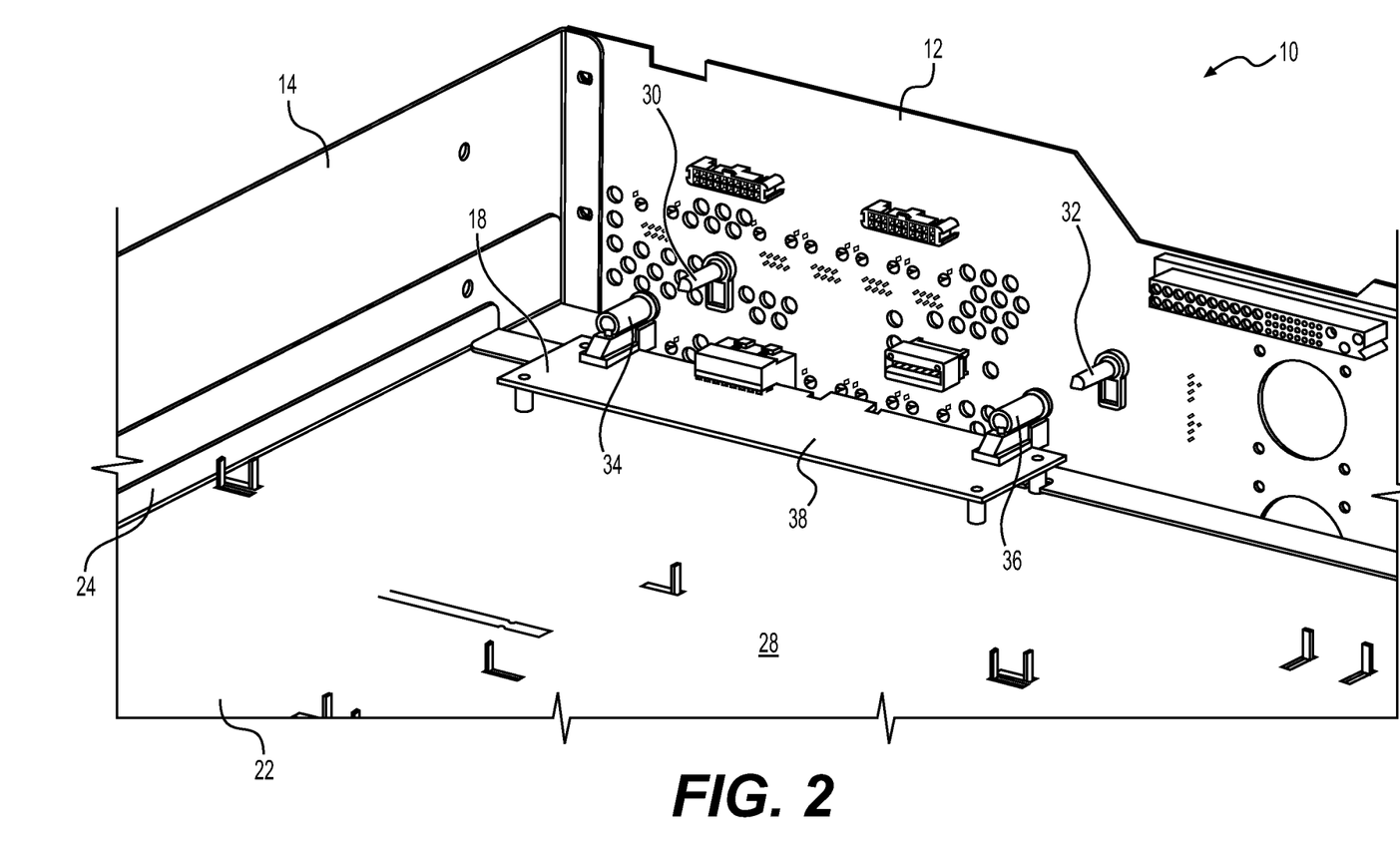
FIG. 2 is a perspective, detailed view of the rack of FIG. 1 with a partially inserted component in accordance with an embodiment of the present technology.
Figure 3:
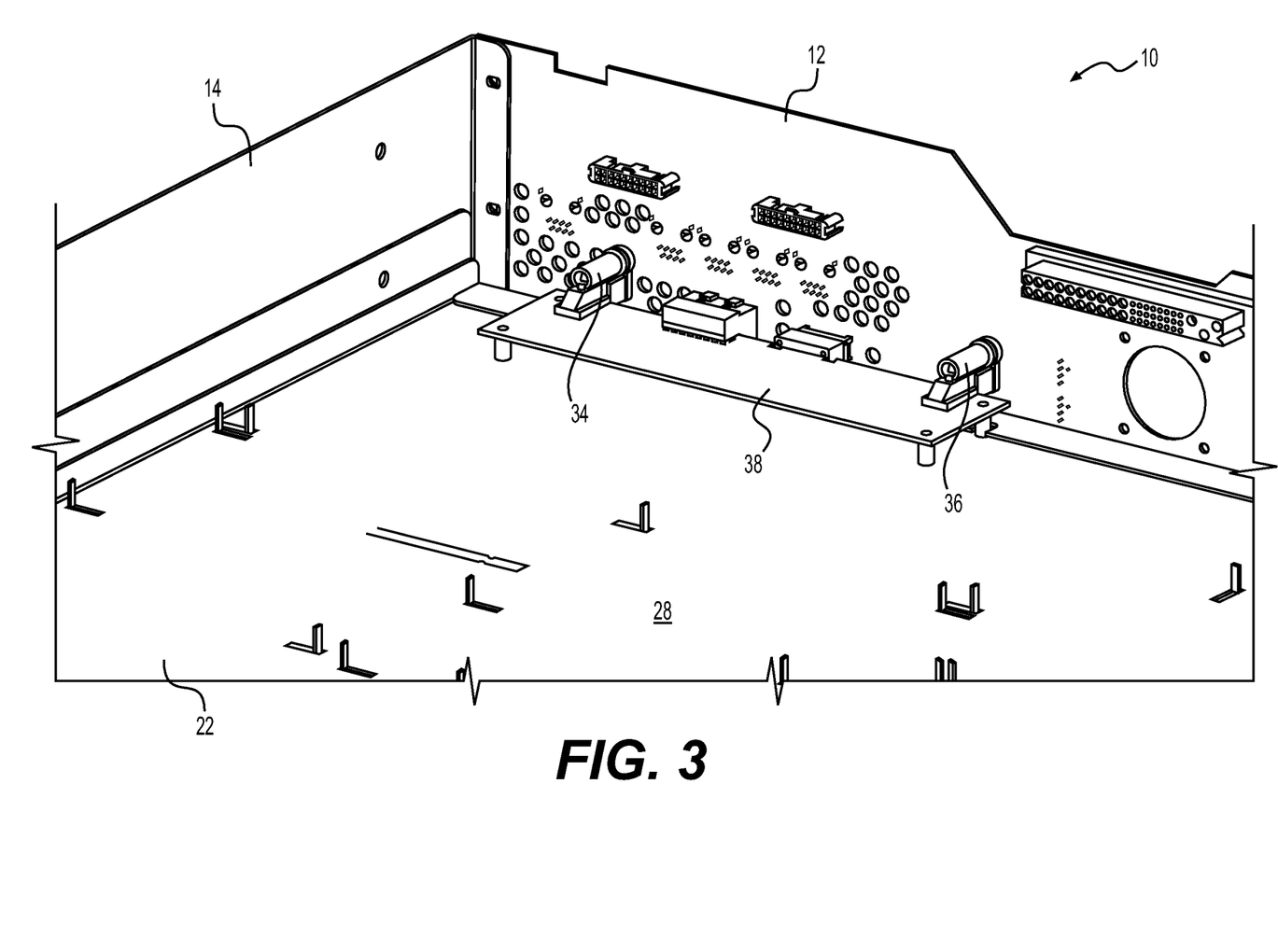
FIG. 3 is a perspective, detailed view of the rack of FIG. 1 with a fully inserted component in accordance with an embodiment of the present technology.

Referring now to the drawings, FIG. 1 is a perspective, exploded view of a rack 10 in accordance with an embodiment of the present technology. The rack 10 may for example be a 19-inch, standard-size rack having dimensions as defined in the EIA/ECA-310-E "Cabinets, Racks, Panels, And Associated Equipment" standard published by The Electronic Components Sector Of The Electronic Industries Alliance, December 2005. FIG. 2 is a perspective, detailed view of the rack 10 of FIG. 1 with a partially inserted component in accordance with an embodiment of the present technology. FIG. 3 is a perspective, detailed view of the rack 10 of FIG. 1 with a fully inserted component in accordance with an embodiment of the present technology. Referring at once to FIGS. 1, 2 and 3, the rack 10 comprises a backplane 12, a pair of side panels 14, 16 extending from the backplane 12, and support members 18, 20 mounted on each side panel 14, 16. Each support member 18, 20 is internal to the rack 10 and adapted to mate with a corresponding side edge 24, 26 of a component 22 that may be inserted in the rack 10. The component 22 is made of a main board 28 on which some electronic devices (not shown) are mounted. The support members 18, 20 mechanically guide an initial alignment of the component 22 upon initial insertion of the component 22 in the rack 10. Two male connectors 30, 32 mounted to the backplane 12 are configured to mate with two female connectors 34, 36 supported by a secondary board 38 that, in turn, is mounted to the rear of the main board 28 of the component 22. Mating of two male connectors 30, 32 with the two female connectors 34, 36 helps to mechanically guide a final alignment of the component 22 when the component is further inserted in the rack 10. Though not illustrated, an additional pair of male connectors may be mounted on the backplane 12 and an additional pair of female connectors may be mounted on the secondary board 38, or on another secondary board, for redundancy purposes.

As illustrated, the two male connectors 30, 32 are defined in a plane parallel to the board 28 and perpendicular to the side panels 14, 18. Configurations in which two male connectors 30, 32 would be positioned vertically, one above the other, or defining an angle not parallel to a surface of the board 28, to mate with similarly positioned female connectors 34, 36, are also contemplated. As shown on FIG. 1, the rack 10 defines a plurality of parallel stages 40, each respective stage 40 being adapted for receiving a respective component 22. Each respective stage 40 includes respective support members 18, 20 mounted to the side panels 14, 16. Each respective support member is internally positioned in the rack 10 and adapted to mate with a corresponding side edge 24, 26 of the respective component 22 to mechanically guide an initial alignment of the respective component 22 upon initial insertion of the respective component 22 in the respective stage 40. Each respective stage 40 also includes a respective set of two male connectors 30, 32 mounted in the backplane 12 and configured to mate with two female connectors 34, 36 of the respective component 22 to mechanically guide a final alignment of the respective component 22 when the respective component 22 is further inserted in the rack 10. Without limitation, a vertical spacing between each of the plurality of parallel stages 40 may correspond to a standard-size rack unit (RU or "U"), for example having a height of 1.75 inches, as defined in the EIA/ECA-310-E standard.

The backplane 12 and the side panels 14 and 16 extend vertically and the support members 18, 20 are positioned so that each component 22 can be received in the rack 10 in a horizontal position. While the positioning of the backplane 12, side panels 14, 16 and components 22 complies with the conventional positioning of the EIA/ECA-310-E standard, the present disclosure is not so limited. For example, the side panels 14 and 16 could extend horizontally (becoming upper and lower panels), in which case the components 22 would extend vertically when received in the rack 10.

Figure 4:
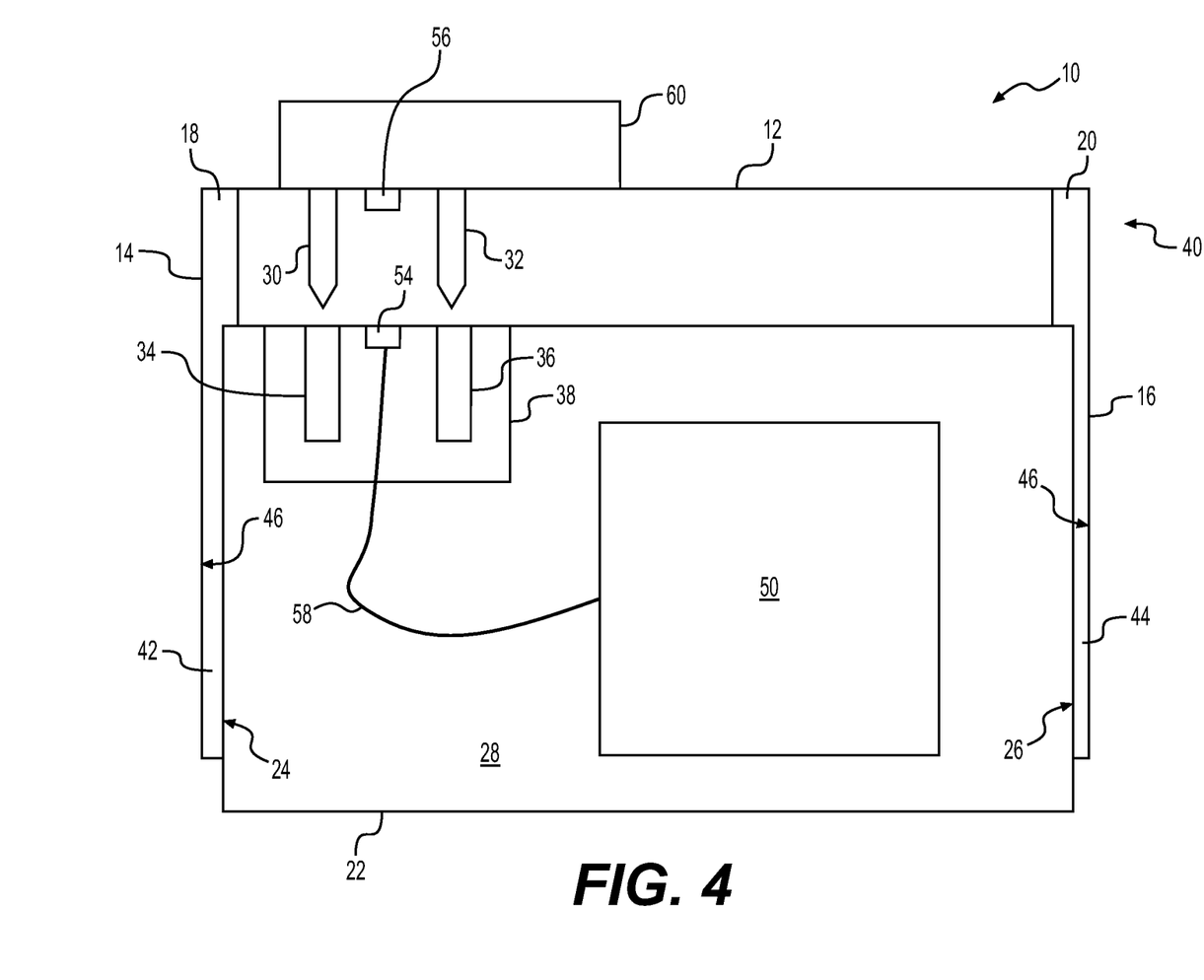
FIG. 4 is schematic top plan view of the rack of FIG. 1 with a partially inserted component in accordance with an embodiment of the present technology.
Figure 5:
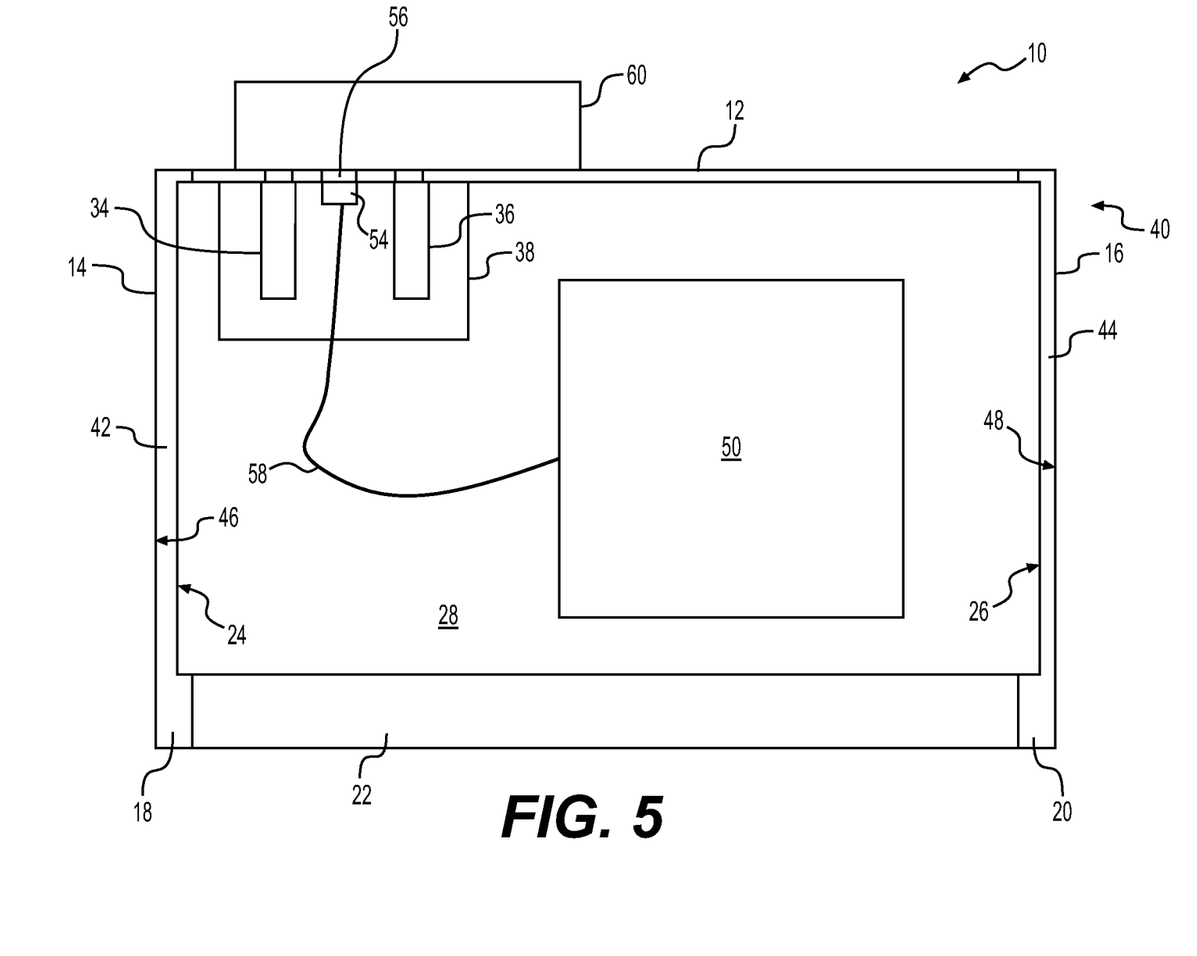
FIG. 5 is schematic top plan view of the rack of FIG. 1 with a fully inserted component in accordance with an embodiment of the present technology.

FIG. 4 is schematic top plan view of the rack 10 of FIG. 1 with the partially inserted component 22 in accordance with an embodiment of the present technology. FIG. 5 is schematic top plan view of the rack 10 of FIG. 1 with the fully inserted component 22 in accordance with an embodiment of the present technology. Referring at once to FIGS. 4 and 5, one stage 40 is illustrated; it is however understood that the rack 10 may include a plurality of parallel stages 40, as illustrated in FIG. 1, each parallel stage 40 being similarly constructed and including the same or equivalent respective elements as those shown on FIGS. 4 and 5.

FIGS. 4 and 5 are not to scale. In particular, the size of lateral gaps 42, 44 between the side edges 24, 26 of the board 28 and internal faces 46, 48 of the side panels 14, 16 are exaggerated for illustration purposes. Relative dimensions of the male connectors 30, 32 and of the female connectors 34, 36 and spacing between the two male connectors 30, 32 or between the two female connectors 34, 36, in view of general dimensions of the rack 10 and of the board 28, do not necessarily reflect an actual implementation.

FIGS. 4 and 5 reproduce several of the elements of FIGS. 1, 2 and 3 and further show a generic electronic component 50 (usually comprising a plurality of components) mounted on the board 28 of the component 22. The electronic component 50 may include, without limitation, any electronic component or group of components that performs processing functions, data storage functions, and like functions adapted for the purposes of the rack 10.

The backplane 12 is connected to a group 60 of electrical components, including for example an AC or DC power source (not shown) for the electronic component 50 as well as data processing devices (not shown). When the component 22 is partially inserted in the rack 10, an initial contact is established between at least one of the two male connectors 30, 32 and at least one of two female connectors 34, 36. This initial contact facilitates the alignment of the component 22 within the rack 10. A contactor 54 and a contactor 56 (FIGS. 4 and 5) are respectively mounted to the secondary board 38 and to the backplane 12. The electronic component 50 is connected to the contactor 54 via electric leads and a data connection (schematically encompassed in a connection 58 for simplicity) that may be implemented as wires or may be at least in part integrated within the board 28. When the component 22 is fully inserted in the rack 10, the contactors 54 and 56 come in contact with one another and thus provide electrical and data connections between the electronic component 50 and electrical components in the backplane 12.

In the embodiment of FIGS. 1 to 5, the female connectors 34, 36 mounted on the component 22 (either directly or on the secondary board 38) and the male connectors 30, 32 mounted on the backplane 12 facilitate the alignment of the component 22 when inserted in the rack 10. The male and female connectors do not necessarily support additional functions or features. In a variant of the present technology, additional connections between the component 22 and the backplane 12 are provided by fluidic ports for exchange of liquid (e.g. water) for cooling the rack 10 and, in particular but without limitation, for cooling equipment mounted behind the backplane 12. These ports include inlet and outlet ports mounted in the backplane 12, as well as feed and return ports that are part of a liquid connector mounted on the component 22.

In a first embodiment, the inlet and outlet ports may double as male connectors 30, 32 and the feed and return ports may double as female connectors 34 and 36, in which case no other component may be present to facilitate the alignment of the component 22 in the backplane 12. In a second embodiment, the inlet and outlet ports may be used as substitutes for one of the male connectors 30, 32 and the feed and return ports may be used as substitutes for one of the female connectors 34, 36. In that second embodiment, the liquid connector (including the feed and return ports) is mounted on the component 22 at a distance from another female connector also mounted on the component 22 while the inlet and outlet ports are mounted on the backplane 12 at a distance from another male connector also mounted on the backplane 12. In a third embodiment, male and female connectors as illustrated in FIGS. 1 to 5 are present in addition to the liquid connector.

Figure 6:
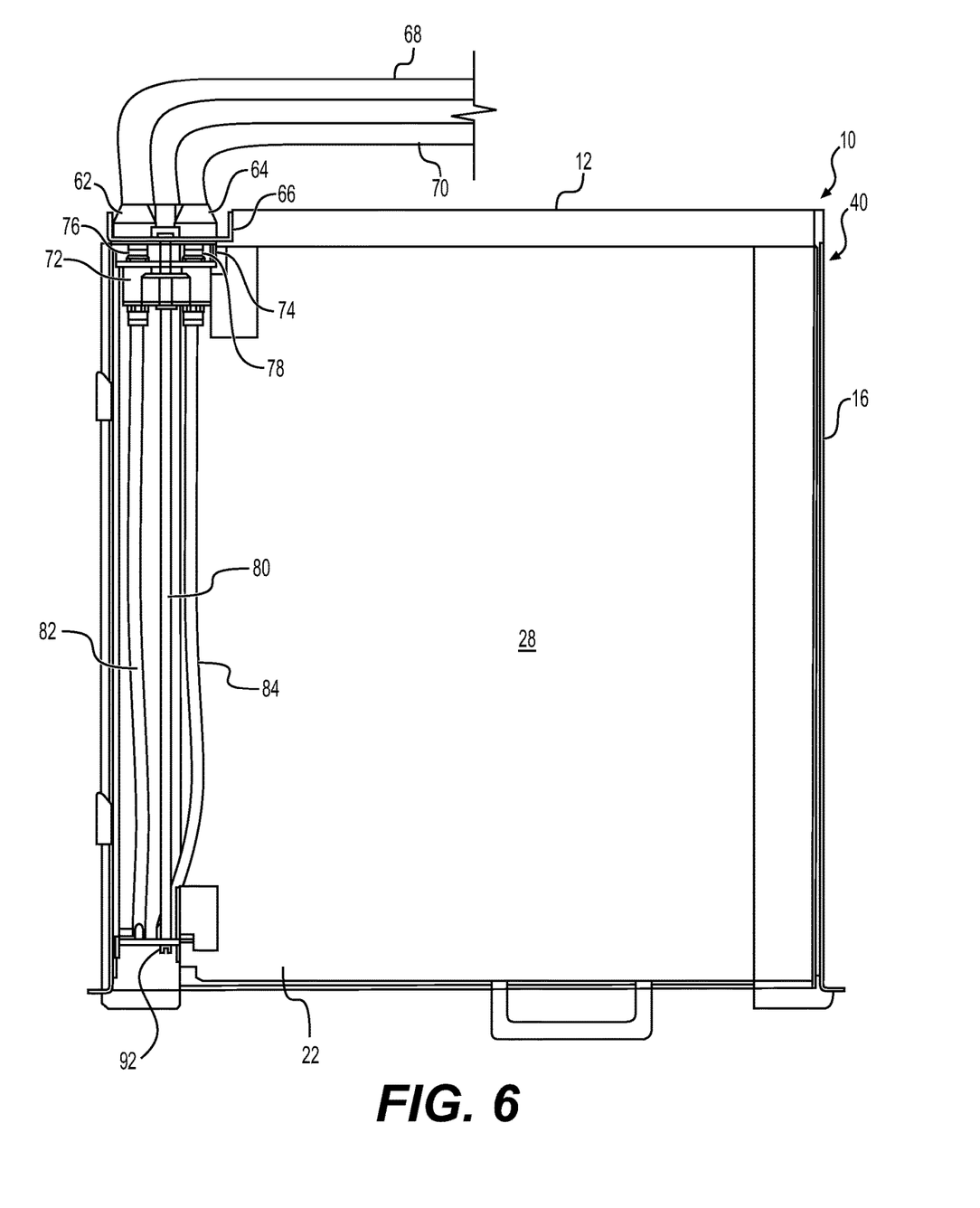
FIG. 6 is a top plan view of a variant of a component insertable in the rack of FIG. 1, the component providing a fluidic connection for cooling purposes.

FIG. 6 is a top plan view of a variant of a component 22 insertable in the rack 10 of FIG. 1, the component 22 providing a fluidic connection for cooling purposes. FIG. 6 illustrates the above-mentioned, non-limiting first embodiment in which the inlet and outlet ports double as male connectors 30, 32 while the feed and return ports double as female connectors 34 and 36. In this variant, a male inlet port 62 and a male outlet port 64 are mounted on a section 66 of the backplane 12. The inlet port 62 is connected to a "cold" inlet tube 68 mounted behind the backplane 12 for distributing liquid, for example water, for cooling of equipment mounted in the rack 10. The liquid returns to the outlet port 64 via a "hot" outlet tube 70. A liquid adaptor 72 is mounted on the component 22, proximally to a rear edge 74 of the component 22. The liquid adaptor 72 comprises a female feed port 76, a female return port 78, and an elongate rod 80 that extends at one end between the feed and return ports 76, 78 and at another end to a front of the component 22. The feed port 76 and the return port 78 are respectively adapted for mating with the inlet port 62 and with the outlet port 64 when the component 22 is inserted in the rack 10. Operation of the elongate rod 80 is described hereinbelow. A "cold" feed tube 82 is connected to the feed port 76 and extends to the front of the component 22. A "hot" return tube 84 is connected to the return port 74 and also extends to the front end of the component 22. When the component 22 is fully installed, cooling liquid may be injected via the feed tube 82 and reach the inlet tube 82, the liquid returning to the return tube 84 via the outlet tube 70.

Figure 7:
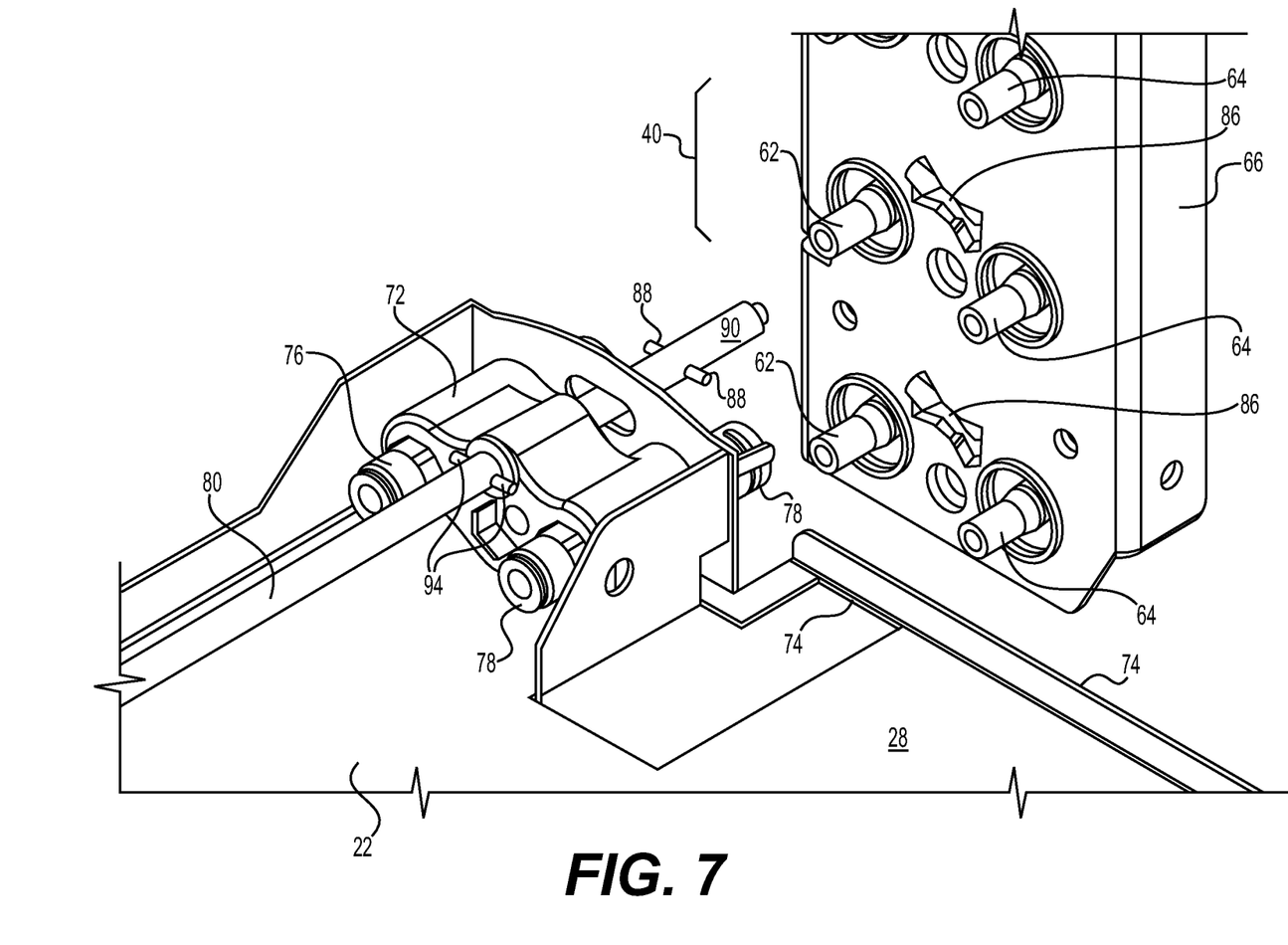
FIG. 7 is a perspective, detailed view of the component of FIG. 6 partially inserted in a rack in accordance with an embodiment of the present technology.
Figure 8:
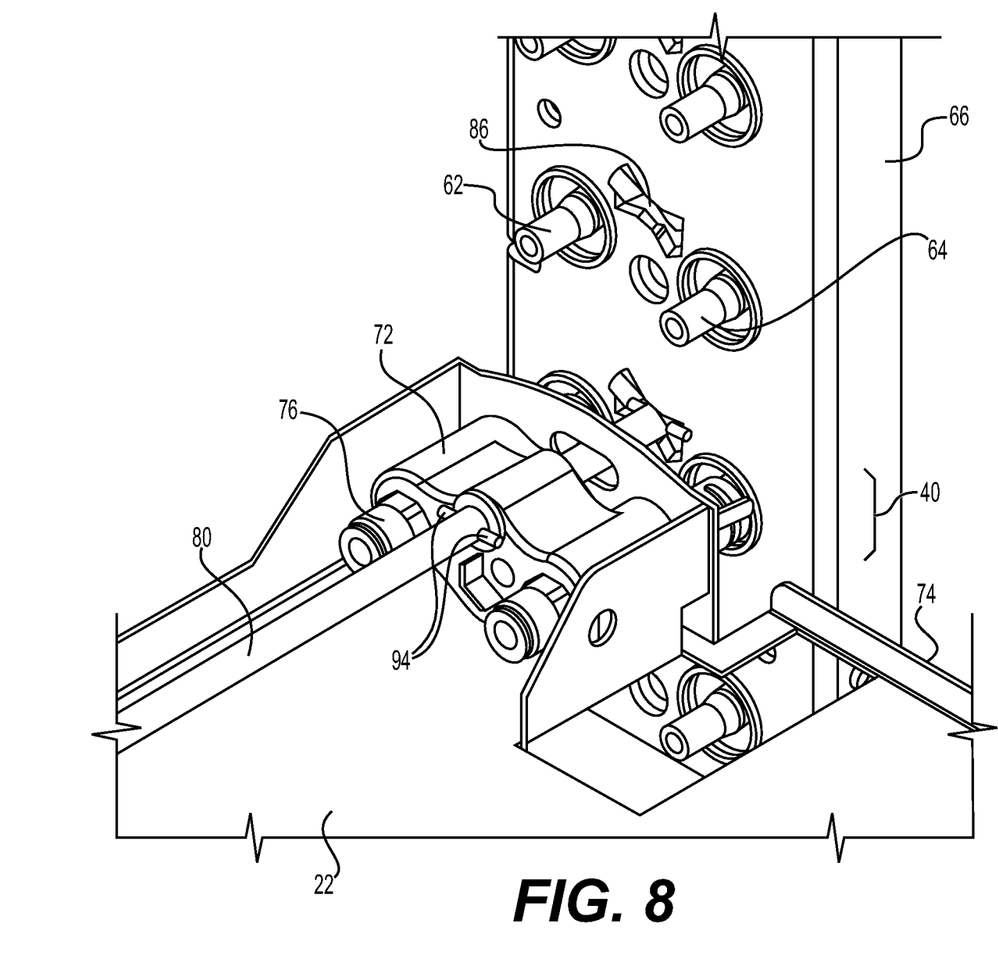
FIG. 8 is a perspective, detailed view of the component of FIG. 6 being substantially fully inserted in the rack in accordance with an embodiment of the present technology.
Figure 9:
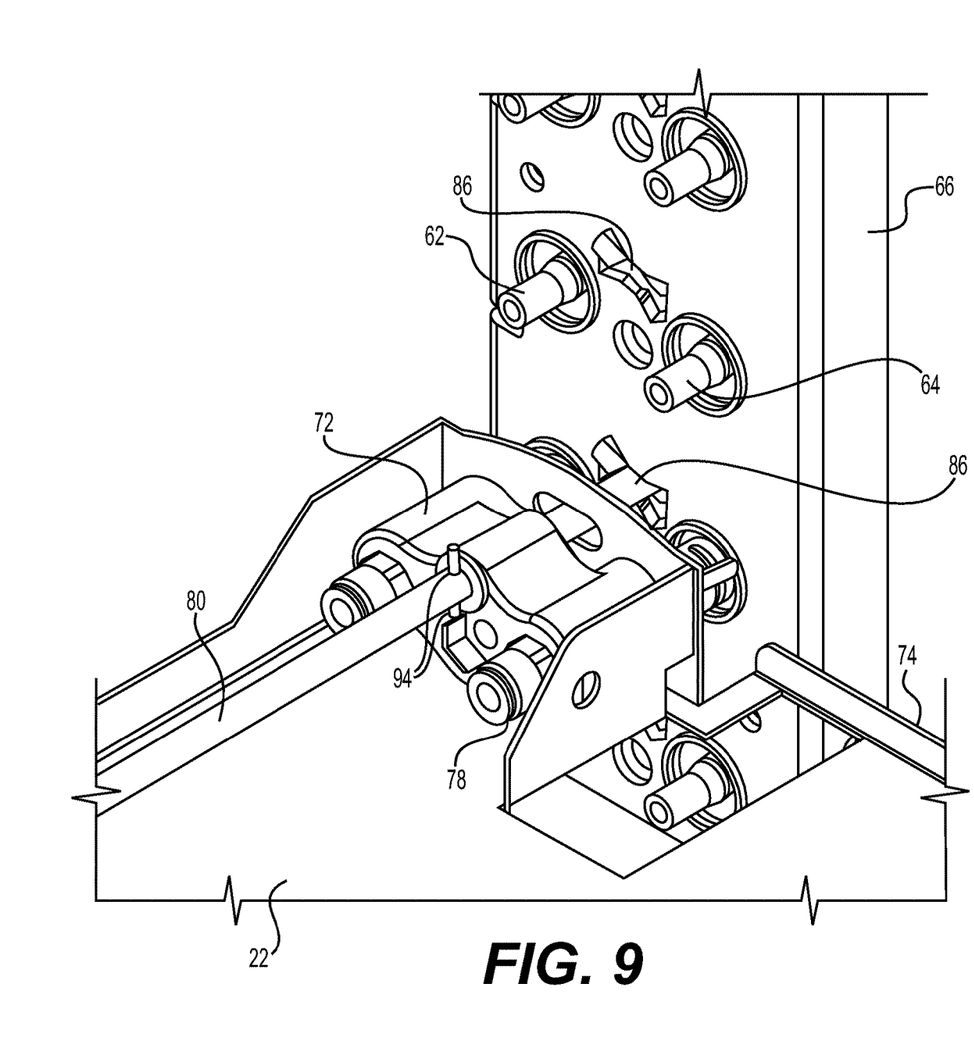
FIG. 9 is a perspective, detailed view of the component of FIG. 6 being fully inserted and locked in the rack in accordance with an embodiment of the present technology.

FIG. 7 is a perspective, detailed view of the component 22 of FIG. 6 partially inserted in the rack 10 in accordance with an embodiment of the present technology. FIG. 8 is a perspective, detailed view of the component 22 of FIG. 6 being substantially fully inserted in the rack 10 in accordance with an embodiment of the present technology. FIG. 9 is a perspective, detailed view of the component 22 of FIG. 6 being fully inserted and locked in the rack 10 in accordance with an embodiment of the present technology. The various tubes of FIG. 6 omitted on FIGS. 6 to 9 in order to simplify the illustration. Referring at once to FIGS. 6 to 9, an inlet port 62 and an outlet port 64 are mounted in each stage 40 on the section 66 of the backplane 12. A slot 86 is formed in each stage 40 of the backplane 12. Each slot 86 is proximal to a corresponding inlet port 62 and to a corresponding outlet port 64. The slot 86 located on a given stage 40 forms an attachment point for the liquid adaptor 72 located on a component 22 that is on the same stage 40 of the rack 10. As illustrated, a center of the inlet port 62, a center of the outlet port 64 and a center of the slot 86 on the same stage 40 generally form a flat triangle. The slot 86 may alternatively be positioned between the corresponding inlet and outlet ports 62, 64. The elongate rod 80 has lateral extensions 88, such as pins, on an end section 90 of the elongate rod 80 that protrudes beyond the rear edge 74 of the component 22, the feed port 76 and the return port 78.

It may be noted that the pair formed by the inlet port 62 and the feed port 76 is interchangeable with the pair formed by the outlet port 64 and the return port 78. In fact, the hot and cold tubes may be connected to any one of the ports as long as consistency is maintained between these connections and a cooling system (not shown) of the rack 10.

A front end 92 of the elongate rod 80 opposite from the end section 90 is configured for receiving a rotating motion from a connectable handle, a screwdriver, or like tool (not shown). The elongate rod 80 is rotated, for example manually, for aligning the lateral extensions 88 with the slot 86 prior to full insertion of the component 22 in the rack 10, substantially as illustrated on FIG. 7. FIG. 8 shows that the end section 90 and the lateral extensions 88 have been inserted via the slot 86 within the backplane 12. The elongate rod 80 has not yet been rotated further from its position on FIG. 7, as evidenced by the orientation of pins 94 that remains unchanged between FIGS. 7 and 8. FIG. 9 shows that the elongate rod 80 is rotated about a quarter of a turn, as evidenced by the different orientation of the pins 94. The rotation of the elongate rod 80 places the lateral extensions 88 out of alignment with the slot 86 after full insertion of the component 22 in the rack 10. This causes the lateral extensions 88 to abut on a face (not shown) of the backplane 12 opposite from the component 22 to maintain the liquid adaptor 72 in place. There may be a slight movement of the component 22 in relation to the backplane 12 between FIGS. 8 and 9, the liquid adaptor 72 and the rear edge 74 of the component 22 being brought slightly closer to the backplane 12 on FIG. 9. This movement is caused by a pressure applied on the liquid adaptor 72 by the pins 94 when the lateral extensions 88 are slightly pulled inward of the backplane 12 by the displacement of the elongate rod 80 on the face of the backplane 12 opposite from the component 22. This movement has at least a double effect, in which the component 22 is held firmly in place in the rack 10 while, in addition, watertight connections are established between the inlet port 62 and feed port 76 and between the outlet and return ports 64, 78. It may be noted that seals (not shown) such as for example Teflon™ or rubber rings may be provided to prevent leakage at the connections between the various ports.

In some applications, the connections of the female feed and return ports 76, 78 of the liquid adaptor 72 to the male inlet and outlet ports 62, 64 mounted on the section 66 of the backplane 12 may suffice to provide proper alignment of the component 22 in the rack 10. Alternatively, an embodiment of the rack 10 may include at once the male connectors 30, 32 and the female connectors 34, 36 as illustrated on FIG. 1-5, along with the liquid adaptor 72 as illustrated on FIG. 6. Another embodiment may include a single male connector 30 mounted on the backplane 12 and a single female connector 34 cooperating with the liquid adaptor 72 and the inlet and outlet ports 62, 64 to provide proper alignment of thee component 22 in the rack 10.

Figure 10:
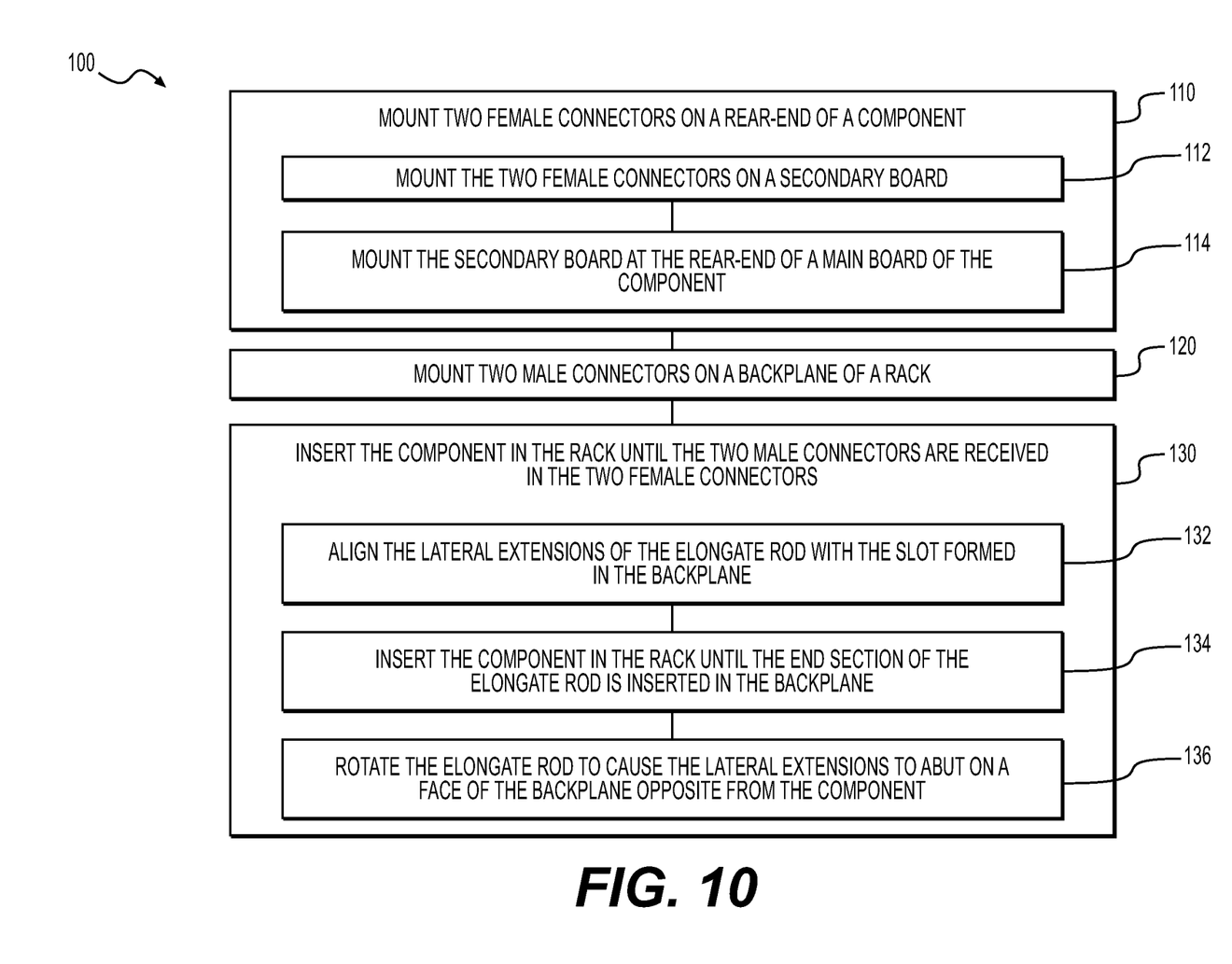
FIG. 10 is a sequence diagram of a method of mounting a component in a rack in accordance with an embodiment of the present technology.

FIG. 10 is a sequence diagram of a method of mounting a non-standard component in the rack 10 in accordance with an embodiment of the present technology. On FIG. 10, a sequence 100 comprises a plurality of operations that may be executed in variable order, some of the operations possibly being executed concurrently, some of the operations being optional. In the sequence 100, operation 110 comprises mounting the two female connectors 34, 36 on a rear end of the component 22. In this operation 110, the two female connectors 34, 36 may be mounted directly on the component 22. Alternatively, operation 110 may comprise sub-operation 112 that includes mounting the two female connectors 34, 36 on a secondary board 38, and sub-operation 114 that includes mounting the secondary board 38 at the rear end of the main board 28 of the component 22. At operation 120, the two male connectors 30, 32 are mounted on the backplane 12 of the rack 10.

At operation 130, the component 22 is inserted in the rack 10 until the two male connectors 30, 32 are received in the two female connectors 34, 36. If at least one of the two male connectors 30, 32 comprises the inlet and outlet ports 62, 64, in which case a corresponding at least one of the two female connectors 34, 36 comprises the feed and return ports 76, 78, operation 130 may comprise sub-operations 132, 134 and 126. At sub-operation 132, the lateral extensions 88 of the elongate rod 80 are substantially aligned with the slot 86 formed on the backplane 12. At sub-operation 134, the component 22 is inserted in the rack 10 until the end section 90 of the elongate rod 80 is inserted in the backplane 12. At sub-operation 136, after full insertion of the component 22 in the rack 10, the elongate rod 80 is rotated for placing the lateral extensions 88 out of alignment with the slot 86 to cause the lateral extensions to abut on the face of the backplane 12 opposite from the component 22 to maintain the component 22 inserted in the rack 10.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A system, comprising:
   a component;
   a rack adapted for receiving the component, the rack comprising:
      a backplane;
      a pair of side panels extending from the backplane;
      a support member mounted on each side panel, each support member being internal to the rack and adapted to mate with a corresponding side edge of the component to mechanically guide an initial alignment of the component upon initial insertion of the component in the rack; and
      two male connectors mounted to the backplane, the two male connectors being sized and configured to mate with two female connectors of the component to mechanically guide a final alignment of the component when the component is further inserted in the rack;
an inlet port mounted on the backplane,
an outlet port mounted on the backplane,
a slot formed on the backplane, the slot being proximally located to the inlet port and to the outlet port; and the system further comprising a liquid adaptor mounted on a rear edge of the component, the liquid adaptor comprising:
a feed port adapted for mating with the inlet port when the component is inserted in the rack,
a return port adapted for mating with the outlet port when the component is inserted in the rack, and
an elongate rod having lateral extensions on an end section protruding beyond the rear edge of the component, the feed port and the return port, the elongate rod being rotatable for aligning the lateral extensions with the slot prior to full insertion of the component in the rack and for placing the lateral extensions out of alignment with the slot after full insertion of the component in the rack to cause the lateral extensions to abut on a face of the backplane opposite from the component to maintain the component inserted in the rack.

2. The system of claim 1, wherein the two male connectors are defined in a plane perpendicular to the side panels.

3. The system of claim 1, wherein:
the side panels and the backplane extend vertically; and
the support members are positioned on the side panels so that the component can be received in a horizontal position.

4. The system of claim 1, wherein the rack defines a plurality of parallel stages, each respective stage being adapted for receiving a respective component, each respective stage comprising:
a respective support member mounted on each of the side panels, each respective support member being internal to the rack and adapted to mate with a corresponding side edge of the respective component to mechanically guide an initial alignment of the respective component upon initial insertion of the respective component in the respective stage; and
a respective set of two male connectors mounted in the backplane and configured to mate with two female connectors of the respective component to mechanically guide a final alignment of the respective component when the respective component is further inserted in the rack.

5. The system of claim 4, wherein a spacing between each of the plurality of parallel stages corresponds to a standard-size rack unit.

6. The system of claim 1, wherein:
the two male connectors respectively comprise the inlet port and the outlet port; and
the two female connectors respectively comprise the feed port and the return port.

7. The system of claim 1, wherein:
one of the male connectors comprises the inlet port and the outlet port; and
one of the female connectors comprises the feed port and the return port.

8. The system of claim 1, wherein the slot is formed between the inlet port and the outlet port.

9. The system of claim 1, wherein a center of the inlet port, a center of the outlet port and a center of the slot form a triangle.

10. The system of claim 1, further comprising:
an inlet tube connected to the inlet port; and
an outlet tube connected to the outlet port;
wherein the inlet tube and the outlet tube are mounted behind the backplane for distributing liquid cooling within the rack.

11. The system of claim 10, further comprising:
a feed tube mounted to the feed port; and
a return tube mounted to the return port;
wherein the feed tube and the return tube extend toward a front of the component for providing liquid cooling to the rack.

12. The system of claim 1, wherein the elongate rod extends to a front edge of the component.

13. The system of claim 1, wherein the rack defines a plurality of parallel stages, the inlet port, the outlet port, the slot, the component and the liquid adaptor being part of a given one of the parallel stages, an additional component being insertable in each other stage of the rack.

14. A system, comprising:
a rack comprising:
a backplane,
an inlet port and an outlet port mounted on the backplane, and
a slot formed on the backplane, the slot being proximally located to the inlet port and to the outlet port;
a component insertable in the rack; and
a liquid adaptor mounted on a rear edge of the component, the liquid adaptor comprising:
a feed port adapted for mating with the inlet port when the component is inserted in the rack,
a return port adapted for mating with the outlet port when the component is inserted in the rack, and
an elongate rod having lateral extensions on an end section protruding beyond the rear edge of the component, the feed port and the return port, the elongate rod being rotatable for aligning the lateral extensions with the slot prior to full insertion of the component in the rack and for placing the lateral extensions out of alignment with the slot after full insertion of the component in the rack to cause the lateral extensions to abut on a face of the backplane opposite from the component to maintain the component inserted in the rack.

15. The system of claim 14, wherein the rack defines a plurality of parallel stages, the inlet port, the outlet port, the slot, the component and the liquid adaptor being part of a given one of the parallel stages, an additional component being insertable in each other stage of the rack.

16. The system of claim 14, wherein:
the rack further comprises a pair of side panels extending from the backplane; and
the rack defines a plurality of parallel stages, each respective stage being adapted for receiving a respective component, each respective stage comprising:
a respective support member mounted on each of the side panels, each respective support member being internal to the rack and adapted to mate with a corresponding side edge of the respective component to mechanically guide an initial alignment of the respective component upon initial insertion of the respective component in the respective stage; and
a respective set of two male connectors mounted in the backplane and configured to mate with two female connectors of the respective component to mechanically guide a final alignment of the respective component when the respective component is further inserted in the rack.

17. The system of claim 14, further comprising:
an inlet tube connected to the inlet port; and
an outlet tube connected to the outlet port;
wherein the inlet tube and the outlet tube are mounted behind the backplane for distributing liquid cooling within the rack.

18. The system of claim 14, wherein the elongate rod extends to a front edge of the component.

* * * * *